(12) United States Patent
Venrooij et al.

(10) Patent No.: US 11,450,550 B2
(45) Date of Patent: Sep. 20, 2022

(54) HANDLER DEVICE FOR HANDLING SUBSTRATES

(71) Applicant: Besi Netherlands B.V., Duiven (NL)

(72) Inventors: Johannes Lambertus Gerardus Maria Venrooij, Duiven (NL); Henricus Antonius Maria Fierkens, Lobith (NL)

(73) Assignee: Besi Netherlands B.V., Duiven (NL)

( * ) Notice: Subject to any disclaimer, the term of this patent is extended or adjusted under 35 U.S.C. 154(b) by 0 days.

(21) Appl. No.: 16/966,097

(22) PCT Filed: Jan. 16, 2019

(86) PCT No.: PCT/NL2019/050020
§ 371 (c)(1),
(2) Date: Jul. 30, 2020

(87) PCT Pub. No.: WO2019/151851
PCT Pub. Date: Aug. 8, 2019

(65) Prior Publication Data
US 2021/0028050 A1    Jan. 28, 2021

(30) Foreign Application Priority Data

Jan. 31, 2018 (NL) ..................................... 2020360

(51) Int. Cl.
*H01L 21/687* (2006.01)
*B65G 47/90* (2006.01)

(52) U.S. Cl.
CPC ........ *H01L 21/68707* (2013.01); *B65G 47/90* (2013.01); *H01L 21/68728* (2013.01)

(58) Field of Classification Search
CPC ......... H01L 21/68707; H01L 21/68721; H01L 21/68728; B25J 15/024; B25J 15/0293; B25J 15/083; B25J 15/103; B25J 15/106
See application file for complete search history.

(56) References Cited

U.S. PATENT DOCUMENTS

| 4,813,732 A | * | 3/1989 | Klem | ................... B25J 13/085 294/103.1 |
| 5,235,995 A | | 8/1993 | Bergman et al. | |

(Continued)

FOREIGN PATENT DOCUMENTS

| EP | 1814142 A1 | 8/2007 |
| JP | 200544882 A | 2/2005 |
| KR | 101703904 B1 | 2/2017 |

*Primary Examiner* — Saul Rodriguez
*Assistant Examiner* — Brendan P Tighe
(74) *Attorney, Agent, or Firm* — The Webb Law Firm

(57) ABSTRACT

The present invention relates to a handler device for handling substrates during semiconductor production, comprising a handling unit having a substrate facing side to be directed to the substrate to be handled, said handling unit being provided with at least three substrate edge grippers protruding from the substrate facing side of the handling unit. The substrate edge grippers are configured to grip the edge of a substrate to be handled, wherein the at least three substrate edge grippers comprise: at least two controlled moveable positioning grippers for gripping the edge of the substrate at two controlled positions and at least one clamping gripper for exerting a controlled clamping force onto the edge of the substrate at least partially directed towards the positioning grippers. The handler further comprises individually controllable actuators connected to the handling unit for independent control of each of the controlled moveable positioning grippers.

20 Claims, 3 Drawing Sheets

(56) References Cited

U.S. PATENT DOCUMENTS

| | | | |
|---|---|---|---|
| 2004/0005212 A1* | 1/2004 | Wu | H01L 21/68728 414/757 |
| 2005/0110288 A1 | 5/2005 | Kern, Jr. | |
| 2006/0086462 A1* | 4/2006 | Inada | H01L 21/68 257/E21.252 |
| 2011/0064545 A1* | 3/2011 | Ishikawa | H01L 21/67103 414/217 |
| 2011/0188022 A1* | 8/2011 | Tanaka | H01L 21/68707 355/72 |
| 2013/0294877 A1 | 11/2013 | Hosek | |
| 2013/0341945 A1* | 12/2013 | Saka | B25J 15/106 294/207 |
| 2014/0103674 A1* | 4/2014 | Mueller | B25J 15/103 294/106 |
| 2018/0222056 A1* | 8/2018 | Suzuki | B25J 9/1664 |
| 2018/0350632 A1* | 12/2018 | Kikumoto | H01L 21/681 |
| 2019/0077028 A1* | 3/2019 | Golan | B25J 15/103 |
| 2019/0176346 A1* | 6/2019 | Ma | B25J 15/0014 |
| 2019/0184580 A1* | 6/2019 | Ueno | B25J 9/0009 |

* cited by examiner

HANDLER DEVICE FOR HANDLING SUBSTRATES

CROSS-REFERENCE TO RELATED APPLICATIONS

This application is the United States national phase of International Application No. PCT/NL2019/050020 filed Jan. 16, 2019, and claims priority to The Netherlands Patent Application No. 2020360 filed Jan. 31, 2018, the disclosures of which are hereby incorporated by reference in their entirety.

BACKGROUND OF THE INVENTION

Field of the Invention

The present invention relates to a handler device for handling substrates during semiconductor production. The present invention further relates to an assembly of a handler according to the present invention and a substrate table. The invention further relates to method for handling substrates during semiconductor production.

Description of Related Art

Handler devices for handling substrates during semiconductor production, such as wafers, are known. Typically, the handler devices and/or the handled substrates comprises reference means for positioning the handler device and substrates in a predetermined position for further handling the substrate. In addition substrate tables are provided with reference means to correctly position the substrate after handled by the handler device. Given the handler devices disclosed in the art, as well as the substrate tables disclosed in the art, it is noted that several problems occur in correctly positioning the substrate and maintaining the substrate in the correct position relative to the handler device. Further it is noted that in semiconductor production substrates, such as wafers, are extremely vulnerable and easily break in case the substrates are improperly deposited on a substrate table. In fact, reference means, e.g. fiducials, present on the substrate table may often be the cause of breaking of the substrate when improperly deposited on the substrate table.

Given the above there is a need of a handler device providing correct positioning and maintaining a substrate relative to the handler device. Further there is a need of a substrate table suitable for receiving the substrate and wherein the substrate is deposited on the substrate table in a correct and predictable way, wherein the substrate table is free of any reference means.

SUMMARY OF THE INVENTION

In order to meet the above needs, the present invention provides hereto handler device for handling substrates during semiconductor production, such as wafers, comprising a handling unit having a substrate facing side to be directed to the substrate to be handled, wherein the handling unit being provided with at least three substrate edge grippers protruding from the substrate facing side of the handling unit. The substrate edge grippers are configured to grip the edge of a substrate to be handled, wherein the at least three substrate edge grippers comprise at least two controlled moveable positioning grippers for gripping the edge of the substrate at two controlled positions and at least one clamping gripper for exerting a controlled clamping force onto the edge of the substrate at least partially directed towards the positioning grippers, and wherein the handler further comprises individually controllable actuators connected to the handling unit for independent control of each of the controlled moveable positioning grippers.

Within the context of the present invention, the handling of substrates involves picking up the substrates from a first surface, moving the substrate between the first and a second surface, and depositing the substrates on the second surface. The second surface is hereby typically formed by a substrate table, which may be part of a molding or singulation system for further processing of the substrates. The individually controllable actuators are typically freely and steplessly adjustable, allowing for an incremental adjustment of the positioning grippers. The substrate can herewith be positioned relative to the handling unit in any desirable (pre-defined) position.

It was found that by providing the handler device of the present invention, a handler device is provided wherein the position of the substrate is controlled and maintained by the handler device itself by using the at least two controlled moveable positioning grippers. By gripping the edge of the substrate, the position of the substrate relative to the handling unit can be easily adjusted, and thus corrected, in case a deviation from the predefined position is detected. Any deviation may occur during the process of clamping of the substrate and/or during movement of the handler device. The position of the substrate may be adjusted, not only during the process of clamping of the substrate with the handler device, but also during movement of the handler device clamping and handling a substrate, i.e. 'on-the-fly'. By providing the handler device of the present invention, there is no need for further reference means positioned on a substrate table the handled substrate is deposited on. Any deviation in a pre-defined position of the substrate relative to the substrate table can be easily corrected using the substrate edge grippers as defined by the present invention. It is noted that the deviation in position of the substrate relative to the substrate table may be caused by shifting of the substrate relative to the handling unit, either during clamping of the substrate by the handling unit or during movement of the handler device, as well as due to deviations in movement of the handler device itself.

In order to control the position of a substrate relative to the handling unit, the handler device may further comprise a controller configured for determining the position of the substrate, comparing the position of the substrate to a predefined reference position and controlling at least one of the individually controllable actuators based on the position of the substrate relative to the predefined reference position. The controlling at least one of the individually controllable actuators hereby typically involves repositioning the substrate relative to the handling unit in case the position of the substrate deviates from the pre-defined reference position. The substrate may be repositioned by adjusting the position of at least one of the controlled moveable positioning grippers, while simultaneously maintaining a desired clamping force exerted by the clamping gripper onto the edge of the substrate, which clamping force is at least partially directed towards the controlled moveable positioning grippers.

It is noted that although the any deviations in movement of the handler device may be corrected by repositioning of the substrate handled by the handler device using the substrate edge grippers as defined by the present invention, the handler of the present invention may comprise at least one mechanical positioning element for orienting the handler to the environment. For example, the at least one mechanical positioning element may be configured to cooperate with a counter-positioning element, e.g. before the handler contacts a substrate and/or before the handler deposit a substrate on the substrate table. In an embodiment of the present invention the at least one mechanical positioning element may be embodied as a protruding pin. In a preferred embodiment of the present invention the handler may comprise at least three mechanical positioning elements for orienting the handler to the environment. In a further embodiment of the present invention, at least one of the mechanical positioning elements for orienting the handler to the environment is constructed with limited thermal dependency (relative to the handler).

The handling unit of the present invention may be provided with a heater. Such heater may be embodied as an electric heater to limit dimension changes of the handler due to temperature changes of the handling unit, e.g. to prevent the handler to have a low temperature in a start-up phase.

Further the handling unit holding the moveable positioning grippers and the at least one clamping gripper may be swivelable connected to a holding frame of the handler device. By swivelably connecting the handling unit to a holding frame of the handler device, the handling unit may be easily oriented in line with the surface of a substrate to be handled.

The individually controllable actuators preferably comprise a servomotor for driving the actuators. Further the individually controllable actuators may comprise a spindle. The controlled moveable positioning gripper may be connected to the spindle by a floating joint for more accurate positioning of the substrate relative to the handling unit.

The clamping gripper may comprise at least one controllable actuator. In an embodiment of the present invention, the handler device comprises two or more clamping grippers. Although each of the two or more clamping grippers may comprise at least one individually controllable actuator, the two or more clamping grippers may also comprise one single controllable actuator controlling the movement of the two or more clamping grippers simultaneously. Preferably, the controllable actuator comprises by the clamping gripper may comprise a pneumatic cylinder in order to provide sufficient clamping force exerted onto the edge of the substrate by the at least one clamping gripper and at least two controlled moveable positioning grippers.

The handler unit may further be provided with at least two safety grippers protruding from the substrate facing side of the handling unit, said safety grippers extend beyond the substrate edge grippers. In a further embodiment of the present invention, the at least two safety gripper (preferably three safety grippers) may provide the function of mechanical positioning elements as described above. By integrating the function of mechanical positioning elements and the function of safety gripper into one and the same element the present invention provides a handler device having a simple and efficient construction. In a preferred embodiment each of the substrate edge grippers is provided with a safety gripper, wherein the safety gripper is positioned adjacent to the substrate edge gripper.

In an embodiment of the present invention the substrate facing side of the handling unit may be provided with suction means configured to secure the position of a substrate to be handled by means of applying an under-pressure. Once the substrate is clamped by the substrate edge grippers of the hander device and the position of the substrate is determined and, in case needed, adjusted, the optional suction means may maintain the substrate in a controllable manner during movement of the handler device.

Although the substrate edge grippers may have any configuration suitable for gripping the edge of a substrate to be handled, at least one of the substrate edge grippers may consist of a single edge contact point. Alternatively at least one of the substrate edge grippers may comprise at least two edge contact points. It is noted that the substrate edge grippers may have two or more edge contact points for gripping 1) the same substrate edge at different positions or 2) two or more different substrate edges (multiple edge substrates), wherein each edge is gripped by one edge contact point.

The at least two controlled moveable positioning grippers may be positioned relative to each other enclosing an angle of 60° to 120°. Preferably the at least two controlled moveable positioning grippers may be positioned relative to each other enclosing an angle of 75° to 105°, more preferably at an angle of 90°.

In a further preferred embodiment of the present invention, a clamping gripper may be position opposite each of the controlled moveable positioning grippers. By providing a clamping gripper opposite each of the controlled moveable positioning grippers, rotation of the substrate during (re-) positioning of the substrate is prevented and, in addition, the pressure exerted by the clamping pressure can be further optimised, i.e. applying the minimal pressure needed to grip the substrate. However, the handler device may comprise only one clamping gripper positioned opposite the at least two controlled moveable positioning grippers.

The handler device of the present invention may further comprise sensors for determining the position of a substrate carried by the at least three substrate edge grippers. By providing a handler comprising sensors for determining the position of a substrate, any deviation in the predefined position of the substrate can be detected and corrected automatically. Alternatively, the position of the individually controllable actuators may be known at any given moment, such that the position of the substrate can be derived from said position of the individually controllable actuators. This typically applies in case the individually controllable actuators comprise servomotors that drive the actuators, in which case the position of the individually controllable actuators correlates with the position of the servomotors. To be able to accurately determine the position of the substrate based on the position of the individually controllable actuators, the handler device may however comprise a home sensor on the basis of which measurements the individually controllable actuators may from time to time be calibrated.

In a possible embodiment, at least one of the substrate edge grippers may comprise a sensor configured for determining the position of said at least one substrate edge gripper relative to the handler device, and in particular at least one of the other substrate edge grippers. In particular, the at least one clamping gripper may be provided with a sensor configured for determining the position of the clamping gripper relative to at least one of the positioning grippers. By determining the position of said at least one substrate edge gripper relative to at least one of the other substrate edge grippers, and thus the distance between said grippers, said sensor(s) allows for the determination of the dimensions, and in particular the diameter of the substrate. With the dimensions of the substrate determined, any deviation in said dimensions may be compensated for by repositioning the substrate relative to the handling unit.

The present invention further relates to an assembly of a handler of the present invention and a substrate table, wherein the substrate table is provided with at least one mechanical counter-positioning element for cooperation with the at least one mechanical positioning element of the handler orienting the handler to the environment. The at least one mechanical positioning element of the handler may be free to move in the at least one counter-positioning elements provided in the substrate table in radial direction. In this respect the substrate table may be provided with one or more radial oriented slits for cooperation with one or more mechanical positioning element of the handler in the form of protruding pins.

The substrate table may in a typical instance be provided with means for retaining the position of the substrate relative to the substrate table once the substrate is deposited on the substrate table. Said means may comprise suction means for applying an under-pressure between the substrate and a surface receiving surface of the substrate table on which substrate is deposited. Given that the position of the substrate relative to the substrate table is retained once the substrate is deposited on the substrate table, the substrate must be positioned on the substrate table in its intended, predefined position. The position of the substrate is therefore controlled and where necessary adjusted relative to the handling unit during handling of the substrate by the handler device, i.e. in advance of being received on the substrate table.

The present invention further relates to a method for handling substrates during semiconductor production, such as wafers, comprising the steps of:
a) providing a substrate; and
b) gripping the edge of the substrate provided in step a) between the at least three substrate edge grippers of the handler according to any of the preceding claims, wherein, after step b), the method further comprises the step of:
c) controlling the position of the substrate gripped by the substrate edge grippers, comprising the steps of:
c1) determining the position of the substrate;
c2) comparing the position determined in step c1) to a pre-defined reference position; and
c3) in case the position of the substrate deviates from the pre-defined reference position, re-positioning the substrate by adjusting the position of at least one of the controlled moveable positioning grippers and maintaining a desired clamping force exerted by the clamping gripper onto the edge of the substrate at least partially directed towards the controlled moveable positioning grippers.

The method of the present invention may further comprise the step of, after step c), applying a low pressure to the surface of the substrate gripped by the substrate edge grippers.

The method of the present invention may further comprise the step of, after step c), bringing the at least two safety grippers of the handling unit into a position to receive the substrate gripped by the handler in case the substrate is accidentally released from its gripped position.

In a preferred embodiment step c) may be performed during handling of the substrate gripped by the substrate edge grippers.

BRIEF DESCRIPTION OF THE DRAWINGS

The present invention will be further elucidated on the basis of the non-limiting exemplary embodiments shown in the following figures. Herein shows.

DESCRIPTION OF THE INVENTION

Figures 1A, 1B:
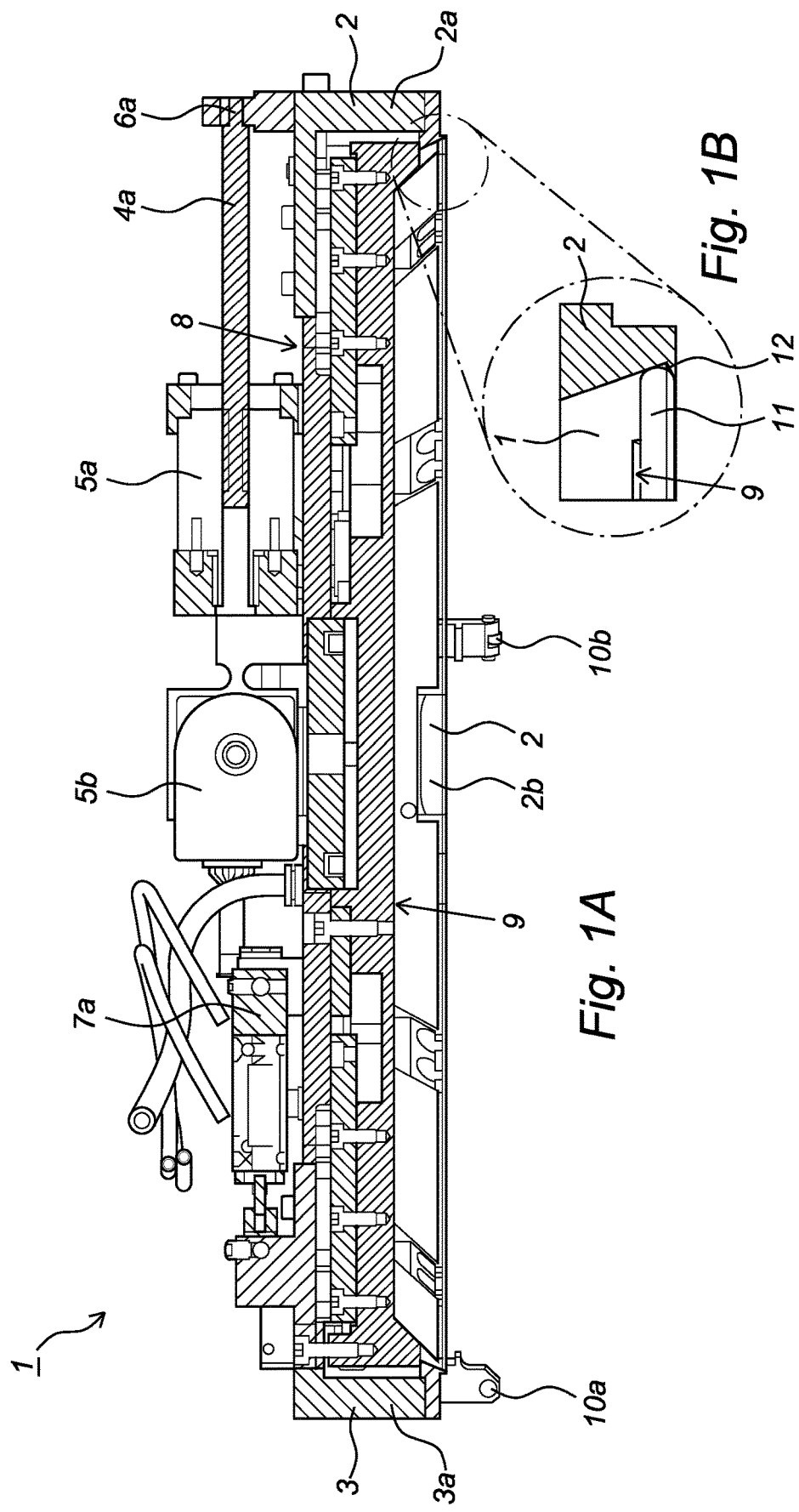
FIG. 1A en 1B a cross-sectional view of the handling unit of the present invention.

FIG. 1A shows a cross-sectional view of the handling unit 1 of the present invention. The handling unit 1 comprises substrate edge grippers 2, 3 of which FIG. 1A shows a controlled moveable positioning gripper 2a and a clamping gripper 3a. The positioning gripper 2a is connected via spindle 4a with an actuator 5a. The positioning gripper 2a is connected to the spindle 4a by a floating joint 6a. The handling unit 1 shown in FIG. 1A further comprises an actuator 5b for controlling another positioning gripper 2b. Also shown in FIG. 1A is a pneumatic cylinder comprising actuator 7a for controlling the clamping gripper 3a. The actuators 5a, 5b, 7a shown in FIG. 1A are mounted to the side 8 of the handling unit 1 opposite the substrate facing side 9 of the handling unit 1. FIG. 1A further shows two safety grippers 10a, 10b protruding from the substrate facing side 9 of the handling unit 1. The safety grippers 10a, 10b extend beyond the substrate edge grippers 2, 3.

FIG. 1B shows a detailed view of a substrate edge gripper 2. FIG. 1B shows a cross-sectional view of a substrate 11 clamped by the handling unit 1 by gripping the edge of the substrate 11 with the substrate edge gripper 2. The substrate 11 faces the substrate facing side 9 of the handling unit 1. The substrate edge gripper 2 is provided with a protruding edge 12 for gently gripping the substrate 11.

Figure 2:
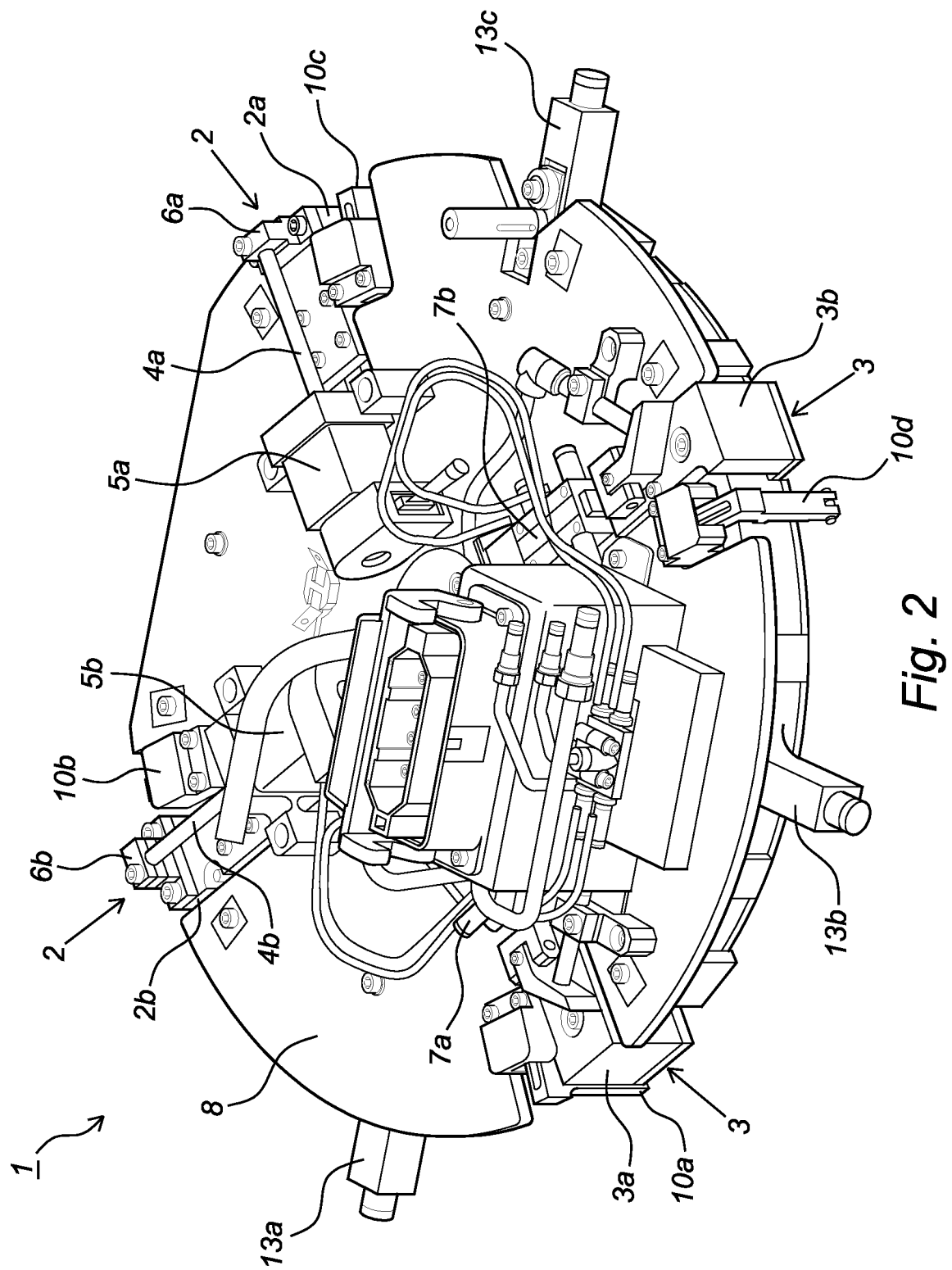
FIG. 2 a perspective view of the handling unit of the present invention.

FIG. 2 shows a perspective view of the handling unit 1 comprising the substrate edge grippers 2, 3 consisting of controlled moveable positioning grippers 2a, 2b and clamping grippers 3a, 3b. The controlled moveable positioning grippers 2a, 2b are connected via a floating joint 6a, 6b to a spindle 4a, 4b. The spindle 4a, 4b is connected to an actuator 5a, 5b. The clamping grippers 3a, 3b are connected to a pneumatic cylinder comprised actuator 7a, 7b. FIG. 2 also shows the safety grippers 10a, 10b, 10c, 10d adjacently positioned to the substrate edge grippers 2, 3. The handling unit 1 shown in FIG. 2 further comprises mechanical positioning elements 13a, 13b, 13c.

Figure 3:
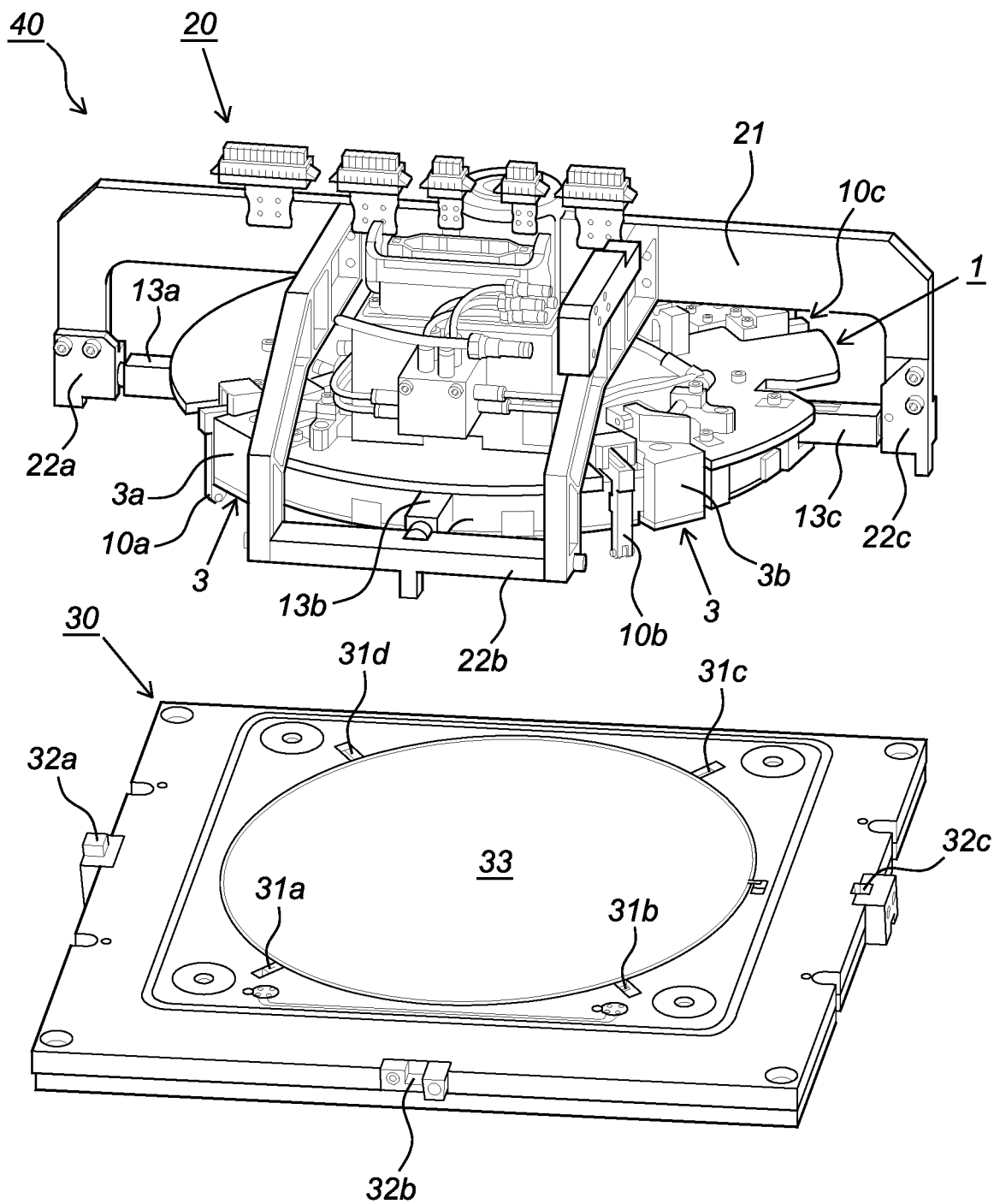
FIG. 3 a perspective view of the assembly of the present invention comprising the handler device and the substrate table.

FIG. 3 shows a perspective view of the assembly 40 of the present invention comprising the handler device 20 and the substrate table 30. The handler device comprises the handling unit 1 as shown in FIGS. 1A, 1B and 2. The handler device comprises a frame 21 to which the handling unit 1 is swivelable connected to. The frame 21 of the handler device 20 is provided with mechanical positioning elements receiving portions 22a, 22b, 22c for receiving the mechanical positioning elements 13a, 13b, 13c of the handling unit 1. Further shown are the clamping grippers 3a, 3b and safety grippers 10a, 10b, 10c.

The substrate table 30 is provided with pin holes 31a, 31b, 31c, 31d, for receiving the safety grippers 10a, 10b, 10c, 10d of the handling unit 1. The substrate table 30 further comprises mechanical counter-positioning elements 32a, 32b, 32c for cooperation with the mechanical positioning elements 13a, 13b, 13c and mechanical positioning elements receiving portions 22a, 22b, 22c of the handler 20. The substrate table 30 further comprises a substrate receiving surface 33.

The invention claimed is:

1. A handler device for handling substrates during semiconductor production, such as wafers, comprising a handling unit having a substrate facing side to be directed to the substrate to be handled, said handling unit being provided with at least three substrate edge grippers protruding from the substrate facing side of the handling unit, wherein the substrate edge grippers are configured to grip the edge of a substrate to be handled,
   characterised in that the at least three substrate edge grippers comprise:
      at least two controlled moveable positioning grippers for gripping the edge of the substrate at two controlled positions; and
      at least one clamping gripper for exerting a controlled clamping force onto the edge of the substrate at least partially directed towards the positioning grippers,
   and in that the handler further comprises:
   at least one mechanical positioning element for orienting the handler to the environment; and
   individually controllable actuators connected to the handling unit for independent control of each of the controlled moveable positioning grippers to correct positioning and maintain the substrate relative to the handler device, wherein at least one individually controllable actuator is connected to at least one controlled moveable positioning gripper.

2. The handler according to claim 1, characterised in that the handler comprises a controller configured for determining the position of the substrate, comparing the position of the substrate to a predefined reference position and controlling at least one of the individually controllable actuators based on the position of the substrate relative to the pre-defined reference position.

3. The handler according to claim 1, characterised in that the handler comprises at least three mechanical positioning elements for orienting the handler to the environment.

4. The handler according to claim 1, characterised in that at least one of the mechanical positioning elements for orienting the handler to the environment is constructed with limited thermal dependency.

5. The handler according to claim 1, characterised in that the handling unit is provided with a heater.

6. The handler according to claim 1, characterised in that the handling unit holding the moveable positioning grippers and the at least one clamping gripper is swivelable connected to a holding frame.

7. The handler according to claim 1, characterised in that the individually controllable actuators comprise a servomotor.

8. The handler according to claim 1, characterised in that the clamping gripper comprises at least one controllable actuator.

9. The handler according to claim 8, characterised in that the at least one controllable actuator comprises a pneumatic cylinder.

10. The handler according to claim 1, characterised in that the handling unit is provided with at least two safety grippers protruding from the substrate facing side of the handling unit, said safety grippers extend beyond the substrate edge grippers.

11. The handler according to claim 1, characterised in that at least one of the substrate edge grippers consist of at least one single edge contact point.

12. The handler according to claim 1, characterised in that a clamping gripper is positioned opposite each of the controlled moveable positioning grippers.

13. The handler according to claim 1, characterised in that the handler comprises sensors for determining the position of a substrate carried by the at least three substrate edge grippers.

14. The handler according to claim 1, characterised in that at least one of the substrate edge grippers, and in particular the at least one clamping gripper, comprises a sensor configured for determining the position of said at least one substrate edge gripper relative to at least one of the other substrate edge grippers, and in particular at least one of the positioning grippers.

15. An assembly comprising the handler according to claim 1 and a substrate table, wherein the table is provided with a least one mechanical counter-positioning element for cooperation with the positioning element of the handler orienting the handler to the environment.

16. A method for handling substrates during semiconductor production, such as wafers, comprising the steps of:
   a) providing a substrate; and
   b) gripping the edge of the substrate provided in step a) between the at least three substrate edge grippers of the handler according to claim 1,
   characterised in that, after step b), the method further comprises the step of:
   c) controlling the position of the substrate gripped by the substrate edge grippers, comprising the steps of:
      c1) determining the position of the substrate;
      c2) comparing the position determined in step c1) to a pre-defined reference position; and
      c3) in case the position of the substrate deviates from the pre-defined reference position, re-positioning the substrate by adjusting the position of at least one of the controlled moveable positioning grippers and maintaining a desired clamping force exerted by the clamping gripper onto the edge of the substrate at least partially directed towards the controlled moveable positioning grippers.

17. The method according to claim 16, characterised in that the method comprises the step of, after step c), applying a low pressure to the surface of the substrate gripped by the substrate edge grippers.

18. The method according to claim 16, characterised in that the method comprises the step of, after step c), bringing at least two safety grippers of the handling unit into a position to receive the substrate gripped by the handler in case the substrate is accidentally released from its gripped position.

19. The method according to claim 16, characterised in that step c) is performed during handling of the substrate gripped by the substrate edge grippers.

20. The handler according to claim 1, wherein the at least one individually controllable actuator is connected to the at least one controlled moveable positioning gripper by a spindle and a floating joint.

* * * * *